(12) United States Patent
Okita

(10) Patent No.: US 6,233,710 B1
(45) Date of Patent: May 15, 2001

(54) REED-SOLOMON DECODING DEVICE

(75) Inventor: Shigeru Okita, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/078,423

(22) Filed: May 13, 1998

(30) Foreign Application Priority Data

May 14, 1997 (JP) .................................................. 9-124411

(51) Int. Cl.$^7$ .................................................. H03M 13/00
(52) U.S. Cl. ........................ 714/784; 714/781; 714/752
(58) Field of Search .................................. 714/784, 781, 714/782, 783, 785, 752, 753, 755, 756, 757, 758, 761, 762, 6

(56) References Cited

U.S. PATENT DOCUMENTS

| | | | |
|---|---|---|---|
| 4,541,091 | * | 9/1985 | Nishida et al. ........................ 371/39 |
| 4,881,232 | * | 11/1989 | Sako et al. ........................... 371/37.4 |
| 5,099,482 | * | 3/1992 | Cameron ............................. 371/37.1 |
| 5,589,994 | * | 12/1996 | Yamasaki et al. ..................... 360/15 |
| 5,644,695 | * | 7/1997 | Blaum et al. .................... 395/182.04 |
| 5,684,810 | * | 11/1997 | Nakamura et al. ................. 371/37.4 |
| 5,712,861 | * | 1/1998 | Inoue et al. ......................... 371/37.1 |
| 6,009,550 | * | 12/1999 | Gosula et al. ........................ 714/769 |
| 6,043,946 | * | 3/2000 | Genheimer et al. .................... 360/53 |

FOREIGN PATENT DOCUMENTS

| | | | |
|---|---|---|---|
| 10-308675 | * | 11/1998 | (JP) ............................... H03M/13/00 |
| 10-322226 | * | 12/1998 | (JP) ............................... H03M/13/00 |
| 11-163739 | * | 6/1999 | (JP) ............................... H03M/13/00 |

OTHER PUBLICATIONS

Ryan, Comparative Performance Between Drop–Out Detection and Viterbi Reliability Metric Erasure Flagging, IEEE Transactions on Magnetics, vol. 28, No. 5, Sep. 1992, pp. 2898–2900.*

Wei et al., High–Speed Reed–Solomon Decoder for Correcting Errors and Erasures, IEE Proceedings I: Communications, Speech and Vision, vol. 140, No. 4, Aug. 1993, pp. 246–254.*

Kobayashi et al., Applications of Erasure Error Correction to Concatenated Partial–Response Channel Code, ICC '99, 1999 IEEE International Conference on Communications, vol. 3, Jun. 1999, pp. 1627–1631.*

* cited by examiner

Primary Examiner—Albert Decady
Assistant Examiner—Samuel Lin
(74) Attorney, Agent, or Firm—Bret J. Petersen; Frederick J. Telecky, Jr.

(57) ABSTRACT

To offer a Reed-Solomon decoding device that can effectively prevent erroneous correction. A Reed-Solomon decoding method that conducts error correction and decodes by using erasure positions showing the position of units of errors for a Reed-Solomon encoded string having parity data of 2t (positive integer) units, which finds the number n for the unit of the error from the above-mentioned erasure position (S13), in the event $0 \leq m_1 \leq n \leq m_2 \leq 2t$ ($m_1$, $m_2$, and n are positive integers) (S14, S15, S18), finds the error value by conducting decoding calculations for the erasure error correction of n units (S19), and conducts the error operation by using the above-mentioned error value and the above-mentioned erasure position (S17).

1 Claim, 5 Drawing Sheets

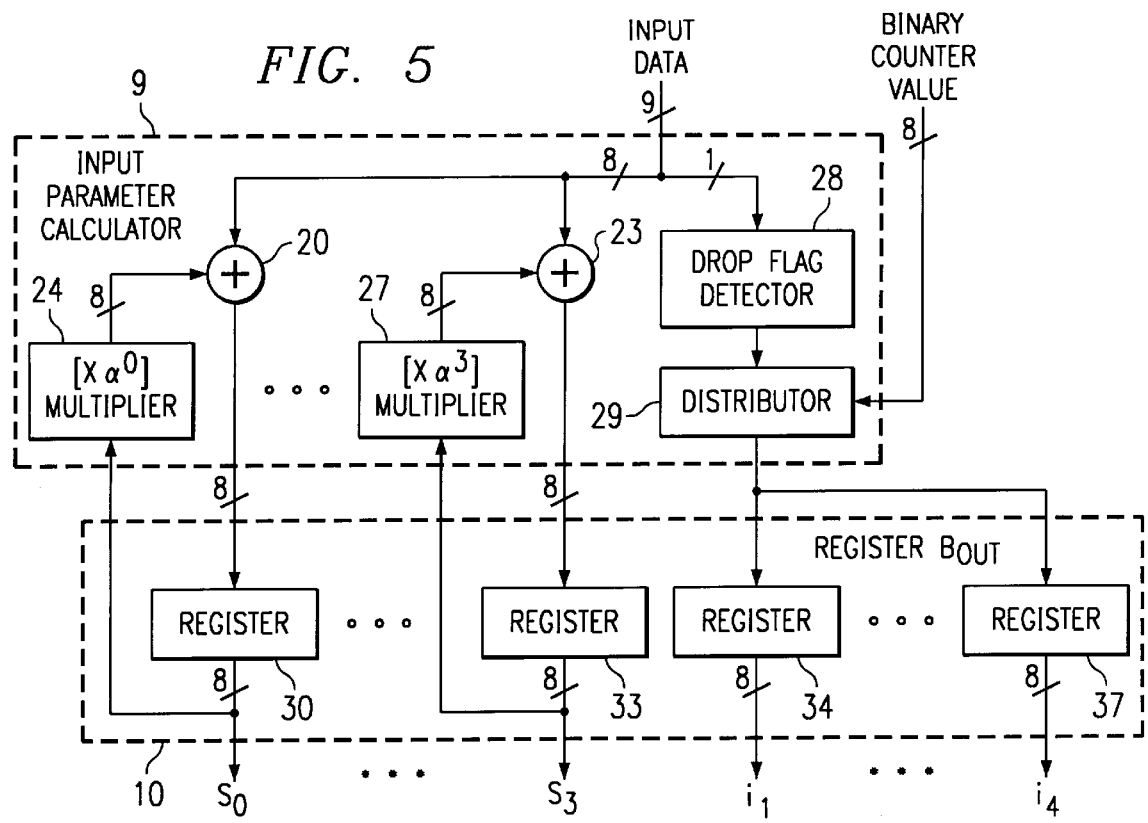
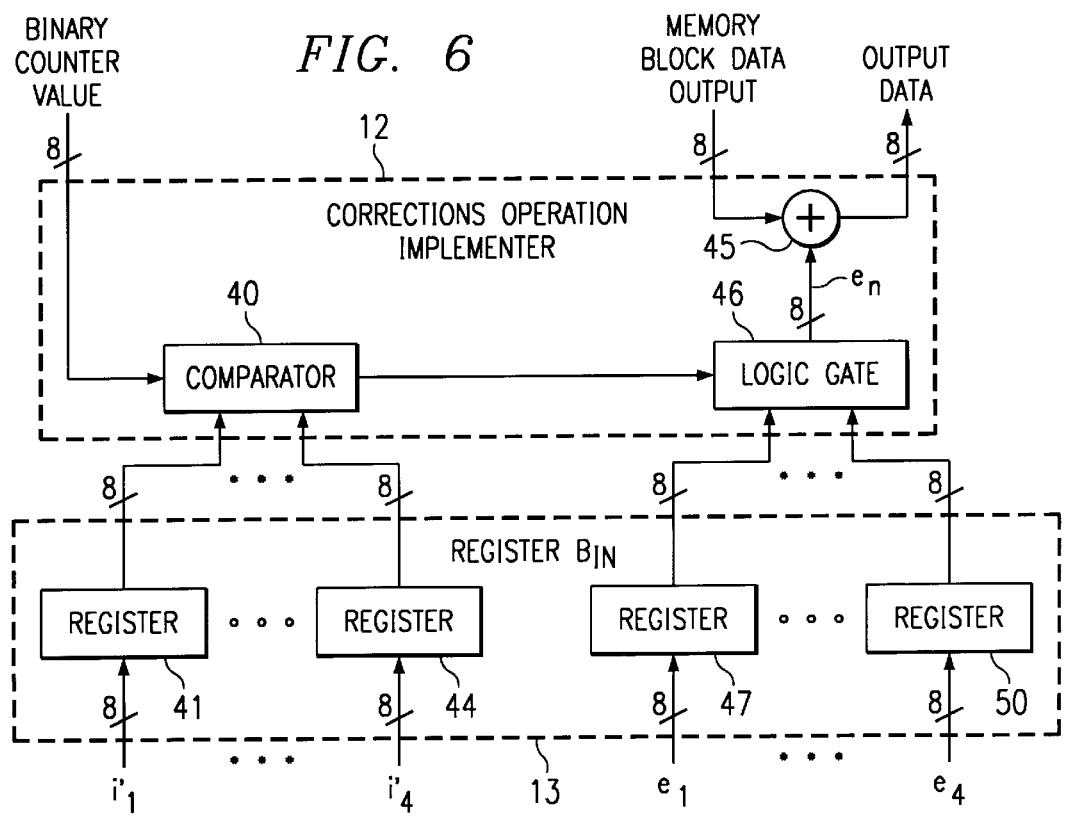

REED-SOLOMON DECODING DEVICE

FIELD OF THE INVENTION

This invention relates to a Reed-Solomon decoding device that decodes Reed-Solomon encoded signals that are used for error correction and coding for recording media and digital transmission.

BACKGROUND OF THE INVENTION

The Reed-Solomon Code (hereinafter, RS code) is mainly used for recording media and external coding of digital transmissions, from the appropriateness in relation to the quality of the encoding efficiency and the error burst.

For example, the error correction code that is used with a compact disc is called the CIRC correction code (cross interleaved Reed-Solomon code); this is a product code that is combined with the interleave method. RS (28, 24) code is used as the external code, and RS (32, 28) code as the internal code, and they are called the C2 code and the C1 code, respectively. In either code, the RS encoding unit is constructed of 1 byte, and a single RS decoding block contains a parity check string of 4 bytes.

Generally, the RS code is a check string of 2t nits, and correction of t units is possible. In the correction of t units, it is necessary to know the t units of error positions, and the value of t units of error corresponding to the respective errors. The RS coding obtains an independent linear formula for 2t units by performing a syndrome calculation at the decoding side in relation to the generation of t units of error. By solving this formula, the error position for the above-mentioned t units, which is an unknown number of 2t units, and the value of the error of the above-mentioned t units corresponding to the respective error positions, can be found.

On the other hand, as for adopting a construction of a product code like the CIRC code, by applying a erasure flag to the RS-encoded block for which correction could not be done at the internal RS decoding in relation to the internal code and the RS-encoded block in which the possibility of error correction is comparatively high, erasure error correction becomes possible in the external RS decoding corresponding to the external code. The erasure units for the internal code to which the erasure flags were applied are dispersed in multiple external RS-encoded blocks by means of deinterleaving. In the erasure error correction, by assuming that there is an error present in the above-mentioned erasure unit, the simultaneous formulas that are obtained from the syndrome calculations are solved. Since the error positions are already known, the value of the error for the maximum 2t can be solved. In other words, it is possible to error-correct a maximum 2t units by executing the erasure error correction for the RS codes having check strings of 2t units.

The method for the erasure error correction is explained by offering an example of the CIRC code.

In the case of the CIRC code, by applying a erasure flag in the RS decoding (C1 decoding) for the C1 code, which is the internal code, the erasure error correction is possible in the RS decoding (C2 decoding) for the C2 code, which is the external code. Because t=2 in both the C1 code and the C2 code, in C1 coding, correction of a maximum 2 bytes is possible, but in the erasure error correction of C2 decoding, the correction of a maximum of 4 bytes is possible. The syndrome $s_0$ to $s_3$ and the error value $e_1$ to $e_4$ in that C2 code can be found as follows.

The code-generating polynomial expression Ge(x) for the CIRC code is shown by Formula 1 below.

[Mathematical Formula 1]

$$Ge(x) = \prod_{j=0}^{3} (x + a^j) \quad [1]$$

Here, $\alpha$ is the primitive element for the Galois field. At this time, $s_0$ to $s_3$ obtained by means of the syndrome calculations from the input string have the relationship shown by the following Formula 2 between the above-mentioned $x_1$ to $x_4$, and $e_1$ to $e_4$.

[Mathematical Formula 2]

$$s0 = e1 + e2 + e3 + e4$$
$$s1 = x1 \cdot e1 + x2 \cdot e2 + x3 \cdot e3 + x4 \cdot e4$$
$$s2 = x1^2 \cdot e1 + x2^2 \cdot e2 + x3^2 \cdot e3 + x4^2 \cdot e4$$
$$s3 = x1^3 \cdot e1 + x2^3 \cdot e2 + x3^3 \cdot e3 + x4^3 \cdot e4$$

Here, the symbol "·" shows multiplication over the Galois field, and the symbol "+" shows addition over the Galois field. Below, as for the four basic mathematical operations between the elements of a given Galois field, it has been decided to show the calculations for that Galois field.

If the error values $e_1$ to $e_4$, which are unknown numbers, are found by solving the simultaneous formulas, the above-mentioned Formula 2 becomes as follows.

First, $e_4$ is obtained as Formula 3 below.

[Mathematical Formula 3]

$$e4 \leftarrow \frac{s3 + (x1 + x2 + x3) \cdot s2 + (x1 \cdot x2 + x2 \cdot x3 + x3 \cdot x1) \cdot s1 + x1 \cdot x2 \cdot x3 \cdot s0}{(x4 + x1) \cdot (x4 + x2) \cdot (x4 + x3)}$$

A simultaneous formula is reconstructed by substituting this $e_4$ obtained in the above-mentioned Formula 2. In other words, as for the Galois field that was used in the CIRC code, by correcting it as in Formula 4 below, noting the fact that the addition and the subtraction are the same, the simultaneous formula of the above-mentioned Formula 2 is transformed to Formula 5 below.

[Mathematical Formula 4]

$$s0 \leftarrow s0 + e4$$
$$s1 \leftarrow s1 + x4 \cdot e4$$
$$s2 \leftarrow s2 + x4 \cdot e4$$

[Mathematical Formula 5]

$$s0 = e1 + e2 + e3$$
$$s1 = x1 \cdot e1 + x2 \cdot e2 + x3 \cdot e3$$
$$s2 = x1^2 \cdot e1 + x2^2 \cdot e2 + x3^2 \cdot e3$$

As for this, the solving of the simultaneous formula is a method that is frequently used when finding the sequence in manual calculations. If $e_3$ is found by solving the simultaneous formula of Formula 5, it becomes like Formula 6 below.

[Mathematical Formula 6]

$$e3 \leftarrow \frac{s2 + (x1 + x2) \cdot s1 + x1 \cdot x2 \cdot s0}{(x3 + x1) \cdot (x3 + x2)}$$

By executing the corrections in the same manner, the simultaneous Formula of the above-mentioned Formula 5 is modified as in Formulas 7 and 8 below.

[Mathematical Formula 7]

$$s0 \leftarrow s0 + e3$$
$$s1 \leftarrow s1 + x3 \cdot e3$$

[7]

[Mathematical Formula 8]

$$s0 = e1 + \phantom{x1\cdot}e2$$
$$s1 = x1 \cdot e1 + x2 \cdot e2$$

[8]

Also, if $e_2$ is found by solving the simultaneous formula of Formula 8, it becomes Formula 9 below.

[Mathematical Formula 9]

$$e2 \leftarrow \frac{s1 + x1 \cdot s0}{x2 + x1}$$

Next, Formula 10 below is obtained by substituting this $e_2$ that was found in the above-mentioned Formula 8.

[Mathematical Formula 10]

$$e1 \leftarrow s0 + e2$$

In this manner, the error values $e_1$ to $e_4$ can be found sequentially.

In the above-mentioned method, in order to distinguish between those which were originally held as information, and the calculation operations that were conducted at the time of the actual decoding, the symbols "=" and "6" are used in different ways. In other words, the Formulas corresponding to the actual decoding calculations are Formulas 3, 4, 6, 7, 9, and 10, and in the Galois field, at least 23 additions, 17 multiplications, and 3 divisions are necessary.

On the other hand, in the event the erasure error correction is not conducted, corrections (double error corrections) can be done for a maximum of 2 bytes in the C2 decoding. At this time, the error values $e_1$, $e_2$, and the error positions $X'_1$, $X'_2$ are found from the syndromes $s_0$ to $s_3$.

Above, the quadruple erasure error correction, in other words, the number of erasure positions, is the decoding calculation processes for 4 cases.

A flow chart for the erasure error correction process according to the method used in the past is shown in FIG. 2.

As is shown in FIG. 2, the syndromes $s_0$ to $s_3$ are totaled from the receive string (step S1), and the erasure positions $x_1$ to $x_4$ are obtained from its erasure flag (step S2). Then, the number of the lead flags is counted, and this count value is set to n (step S3).

Next, in the case of n=4(2t) (step S4), the decoding calculations for the quadruple erasure error corrections are conducted according to the algorithms of the above-mentioned Formulas 3, 4, 6, 7, 9, and 10, and the error values $e_1$ to $e_4$ are found (step S5). Then, the correction operation is conducted by using the error values $e_1$ to $e_4$ and the erasure positions $x_1$ to $X_4$ (step S6).

Also, in the case of n=3(t<n<2t) (step S7), the decoding calculations for the triple erasure error corrections are conducted according to the algorithms of the above-mentioned Formulas 6, 7, 9, and 10, and the error values $e_1$ to $e_4$ are found (step S8). Then, the correction operation is conducted by using the error values $e_1$ to $e_3$ and the erasure positions $x_1$ to $x_3$ (step S6).

On the other hand, in the case of $n \leq 2$ (T), the prescribed error corrections corresponding to this are executed (step S9, S6).

As was mentioned above, in the case of a quadruple erasure error correction, all of the syndromes $s_0$ to $s_3$ were used, but in the triple erasure error correction used in the past, only $s_0$ to $s_2$ were used. Also, the correction method in the case of $n \leq 2$ (=t) was not clear. Lastly, in the method used in the past, there was the problem that the countermeasures for the case when an erroneous correction was generated were not sufficiently executed.

Below, an explanation is given in regard to the general construction of the Reed-Solomon decoding device that conducts the erasure error correction process presented above.

FIG. 3 is a construction diagram of the Reed-Solomon decoding device used in the past.

As is shown in FIG. 3, the Reed-Solomon decoding device 1 is equipped with the memory block 2, the bus I/F block 3, and the decoding calculations processing section 4.

The memory block 2 is equipped with the cache memories 5, 6, and the switches 7, 8.

The switch 7 selectively outputs the input data to the cache memories 5, 6. The switch 8 selectively outputs the storage content of the cache memory 5 to the corrections operation implementer 12.

The bus I/F block 3 is equipped with the input parameter calculator 9, the register $B_{OUT}$ 10, the binary counter 11, the corrections operations implementer 2, and the register $B_{IN}$ 13.

The decoding calculations processing section 4 is equipped with the switch 14, the register $G_{IN}$ 15, the register $G_{OUT}$ 16, and the decoding calculator 17.

FIG. 4 shows the time sequence for the data and the construction elements during the operation of the Reed-Solomon decoding device 1, (A) shows the input data, (B) the output data, (C) the storage condition of the register $B_{OUT}$ 10, (D) the storage condition of the register $B_{IN}$ 13, (E) the storage condition of the register $G_{OUT}$ 16, (F) the storage condition of the register $G_{IN}$ 15, and (G) the processing condition of the decoding calculator 17, respectively.

As is shown in FIG. 4, when the input/output is conducted for the input data related to the C1 code in the cache memory 5 to the memory block 2, as for the bus I/F block 3, the calculations are conducted for the decoding calculation input parameters by the input parameter calculator 9 for the input data related to the C1 code, and the correction operations are conducted by the correction operations implementer 12. Also, at this time, the C2 code processing is being conducted in regard to the input data related to the C2 code in the decoding calculations processing section 4.

Also, when the input/output is conducted for the input data related to the C2 code in the cache memory 6, as for the bus I/F block 3, the calculations are conducted for the decoding calculations input parameters by the input parameter calculator 9 for the input data related to the C2 code, and the correction operations are conducted by the correction operations implementer 12. Also, at this time, in the decoding calculations processing section 4, the C1 coding process is being conducted in regard to the input data related to the C1 code.

Here, what is referred to as the decoding calculations input parameters, basically, is the syndrome (S) and the position (I).

The syndrome (S) is calculated by means of combining the input parameter calculator 9 and the register $B_{OUT}$ 10 shown in FIG. 3.

FIG. 5 is a construction diagram of the input parameter calculator 9 and the register $B_{OUT}$ 10.

As is shown in FIG. 5, the input parameter calculator 9 is equipped with the multipliers 24 to 27, the adders 20 to 23, the flag detector 28, and the distributor 29.

Also, the register $B_{OUT}$ 10 is equipped with the registers 30 to 33 and the registers 34 to 37.

As for the multipliers 24 to 27, the multiplier coefficients are the multipliers for a Galois field of fixed values, and conduct the multiplications of $X\alpha^0$, $X\alpha^1$, $X\alpha^2$, $X\alpha^3$, respectively.

The erasure flag detector 28 detects whether or not the erasure flag contained in the input data is a "1."

The distributor 29 outputs and stores the output of the binary counter 11 which operates corresponding to each RS unit position contained in the input data in any of the registers 34 to 37 of the register $B_{OUT}$ 10.

The storage results of these registers 34 to 37 show the erasure positions (I).

The erasure positions (I) are converted to the expression of the Galois field, in other words, from "i" to "$\alpha^i$", by means of a later presented converter, at the decoding calculator 17 shown in FIG. 3.

Specifically, $I=\{i_1, i_2, i_3, i_4\}$ is converted to $X=\{x_1, x_2, x_3, x_4\}$.

The decoding calculations corresponding to the above-mentioned Formulas 3, 4, 6, 7, 10 in the case of executing the quadruple erasure error corrections are conducted at the decoding calculations processing section 4, and using the decoding calculation input parameters ($S=\{s_0, s_1, s_2, s_3\}$ from the register $B_{OUT}$ 10, and the $X=\{x_1, x_2, x_3, x_4\}$ that was obtained by converting the $I=\{i_1, i_2, i_3, i_4\}$, the decoding calculation output parameters $E=\{e_1, e_2, e_3, e_4\}$ and $X'=X=\{x_1, x_2, x_3, x_4\}$ are obtained. In the event the erasure error correction is not conducted, in the above-mentioned double error correction, by using the decoding calculation input parameters ($S=\{s_0, s_1, s_2, s_3\}$, the decoding calculation output parameters $E=\{e_1, e_2\}$ and $X'=\{x'_1, x'_2\}$ are obtained.

The error positions X for X' are converted to exponential values, in other words, from $\alpha^i$ to i in the later explained converter in the decoding calculation processing section 4. Specifically, $X'=X=\{x_1, x_2, x_3, x_4\}$ is converted to $I=\{i_1, i_2, i_3, i_4\}$, and $X'=\{x'_1, x'_2\}$ is converted to $I'=\{i'_1, i'_2\}$.

FIG. 6 is a construction diagram of the corrections operation implementer 12 and the register $B_{IN}$ 13.

As is shown in FIG. 6, the corrections operations implementer 12 is equipped with the comparator 40, the adder 45, and the logic gate 46.

Also, the register $B_{IN}$ 13 is equipped with the registers 41 to 44 and the registers 47 to 50.

The bus I/F block 3 executes the correction operations by using the error value (E) and the error positions (I') that are inputted from the register $G_{OUT}$ 16.

The binary counter 11 operates in correspondence with the switching of the output from the cache memories 5, 6 by means of the switches 7, 8, and when the binary count value of the binary counter 11 matches any one of the ($i'_n$) construction elements for the error position (I'), a corresponding error value $e_n$ is output to the adder 45 from the logic gate 46. Also, in the adder 45, the Galois field calculations are conducted in regard to the error value $e_n$ and the data output of the memory block from the switch 8, and the addition results become the output data.

Next, an explanation is given in regard to the decoding calculations processing section 4.

FIG. 7 is a construction diagram of the decoding calculations processing section 4.

As is shown in FIG. 7, the decoding calculations processing section 4 is equipped with the microcode ROM 50, the register 51, the destination controller 52, the working register 53, the GLU (Global Logic Unit) 54, and the port selector 55.

As in the CIRC code, t is less than 4, and in the event the solution is found directly from the simultaneous Formula, and when the processing speed can be comparatively slow, a RISC (Reduced Instruction Set Computer) type of device can be used as the decoding calculations processing section 4.

In the decoding calculations processing section 4, each calculation is conducted sequentially, and the calculations sets are time shared by GLU 54. Also, a series of calculation processes are microcoded, are stored in the microcode ROM 50 as instruction codes, and the process routine (routine for readout from the memory) is controlled by means of the ROM address from the sequencer 51.

Also, during the operations the calculation results are temporarily stored in the multiple working registers 53 that were initialized beforehand, but as to which working register 53 to store in, this is recorded in the destination control code within the instruction code.

According to this method, the process speed is limited, but along with being able to downsize the device due to the time sharing by the GLU 54, the freedom of design can be increased due to the micro-encoding of the calculation processes.

For example, the addition of two elements of the Galois field is equivalent to each bit of an exclusive OR logic operation, and can be realized in one step in the decoding calculations processing section 4. In other words, the GLU 54 includes the function of an exclusive OR logic operation for each bit. However, multiplication in a Galois field is far more complicated compared to addition, and if an attempt is made to realize this by using ROM, it comes to obtain one byte of output for an address input of two bytes, and the scale becomes extremely large.

An explanation is given in regard to the construction of the GLU 54.

FIG. 8 is a construction diagram of the GLU 54.

As is shown in FIG. 8, the GLU 54 is equipped with the logic operation 60, 61, the converters 62, 63, and the operation selector 64.

In the GLU 54, the respective elements of the Galois field for the two input data (a, b) are converted to the values for the exponents for the corresponding original elements, in other words, $\alpha^i$ is converted to i by the converter 62, and additions between the same exponents are executed. Then, the obtained addition results are converted to the element for the corresponding Galois field by the converter 63, in other words, i is converted to $\alpha^i$.

For example, the multiplication of $\alpha^v$ and $\alpha^w$ is executed, and in obtaining $\alpha^{v+w}$, the four calculations shown in the following Formula 11 are necessary, and at least four steps are required in the GLU 54.

[Mathematical Formula 11]

$$1: v \leftarrow a^v$$
$$2: w \leftarrow a^w$$
$$3: v+w \leftarrow v, w$$
$$4: a^{v+w} \leftarrow v+w$$

Division is also tone in the same manner, and subtraction is executed in place of the addition in the multiplication.

Therefore, in the above-mentioned method, in the finding of the error values $e_1$ to $e_4$, since the multiplication=division in the above-mentioned Formulas 3, 4, 6, 7, 9, and 10 are done 20 times, even with just this, 80 steps or more become necessary. If the 23 steps of addition are included in this, it becomes a total of more than 103 steps.

This invention was made by reviewing the above-mentioned prior art, and its purpose is to offer a Reed-Solomon decoding method that can effectively prevent erroneous correction.

Also, the objective of this invention is to offer a Reed-Solomon decoding method in which the correction method is clarified in the case of $n \leq 2$ (=t) in regard to the data words of n units.

SUMMARY OF THE INVENTION

In order to solve the problem points of the above-mentioned prior art, and to achieve the above-mentioned objectives, the Reed-Solomon decoding method of this invention conducts error correction and decodes by using erasure positions showing the position of units of errors for a Reed-Solomon encoded string having parity data of 2t (positive integer) units, which finds the number n for the unit of error from the above-mentioned erasure position; in the event $0 \leq m_1 \leq n \leq m_2 \leq 2t$ ($m_1$, $m_2$, and n are positive integers), it finds the error value by conducting decoding calculations for the erasure error correction of n units, and conducts the error operation by using the above-mentioned error value and the above-mentioned erasure position.

Also, the Reed-Solomon decoding method of this invention, preferably, in the event n=2t, conducts the erasure error correction for 2t units.

Also, the Reed-Solomon decoding method of this invention, preferably, in the event $n<m_1$ or $n>m_2$, conducts the error correction for less than 2t without using the above-mentioned erasure position.

BRIEF DESCRIPTION OF THE DRAWINGS

FIG. 5 is a construction diagram of the input parameter calculator and the register shown in FIG. 3.

FIG. 6 is a construction diagram of the input parameter calculator and the register shown in FIG. 3.

Figure 1:
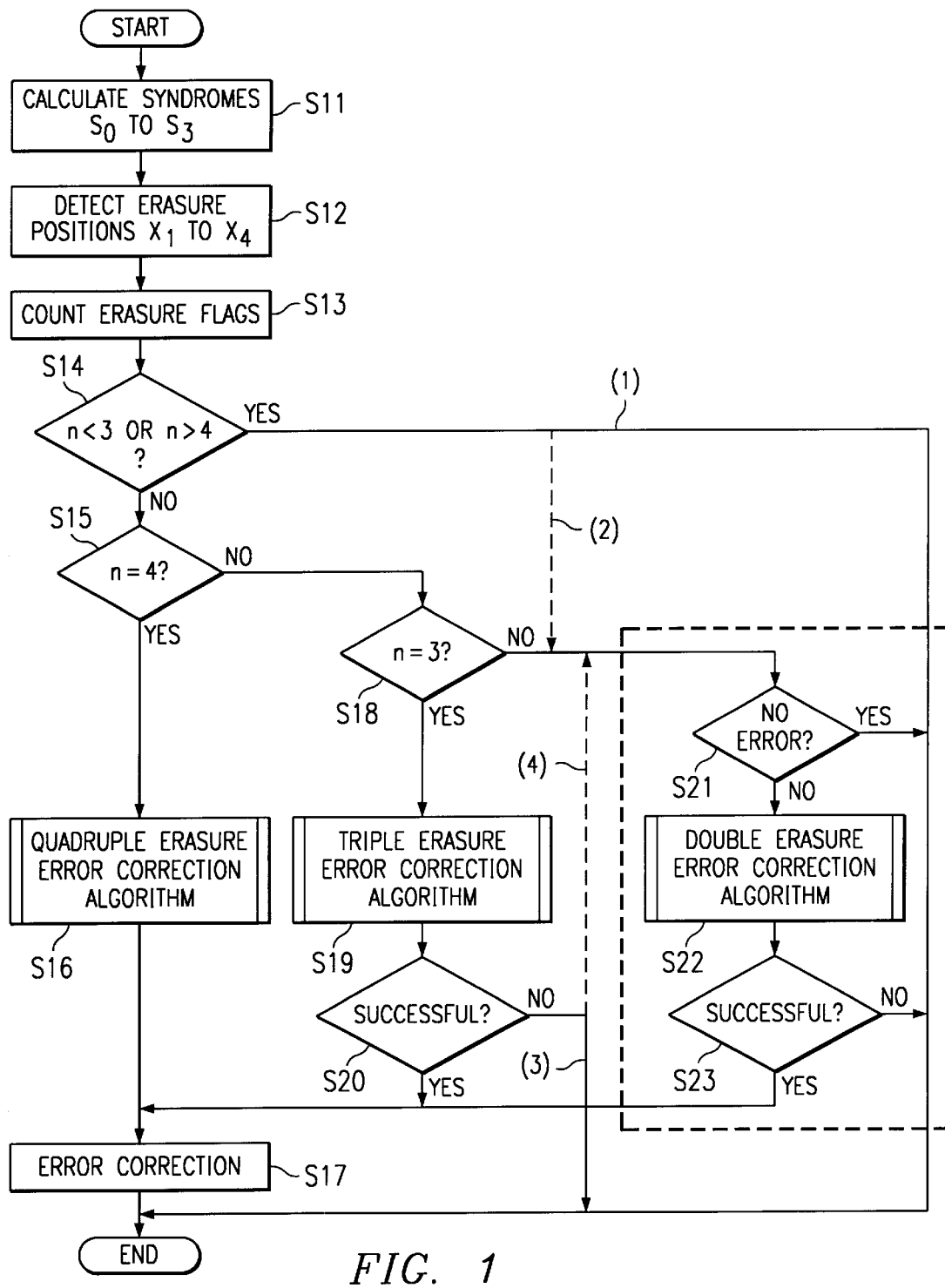
FIG. 1 is a flow chart for a Reed-Solomon decoding method related to an embodiment of this invention.
Figure 2:
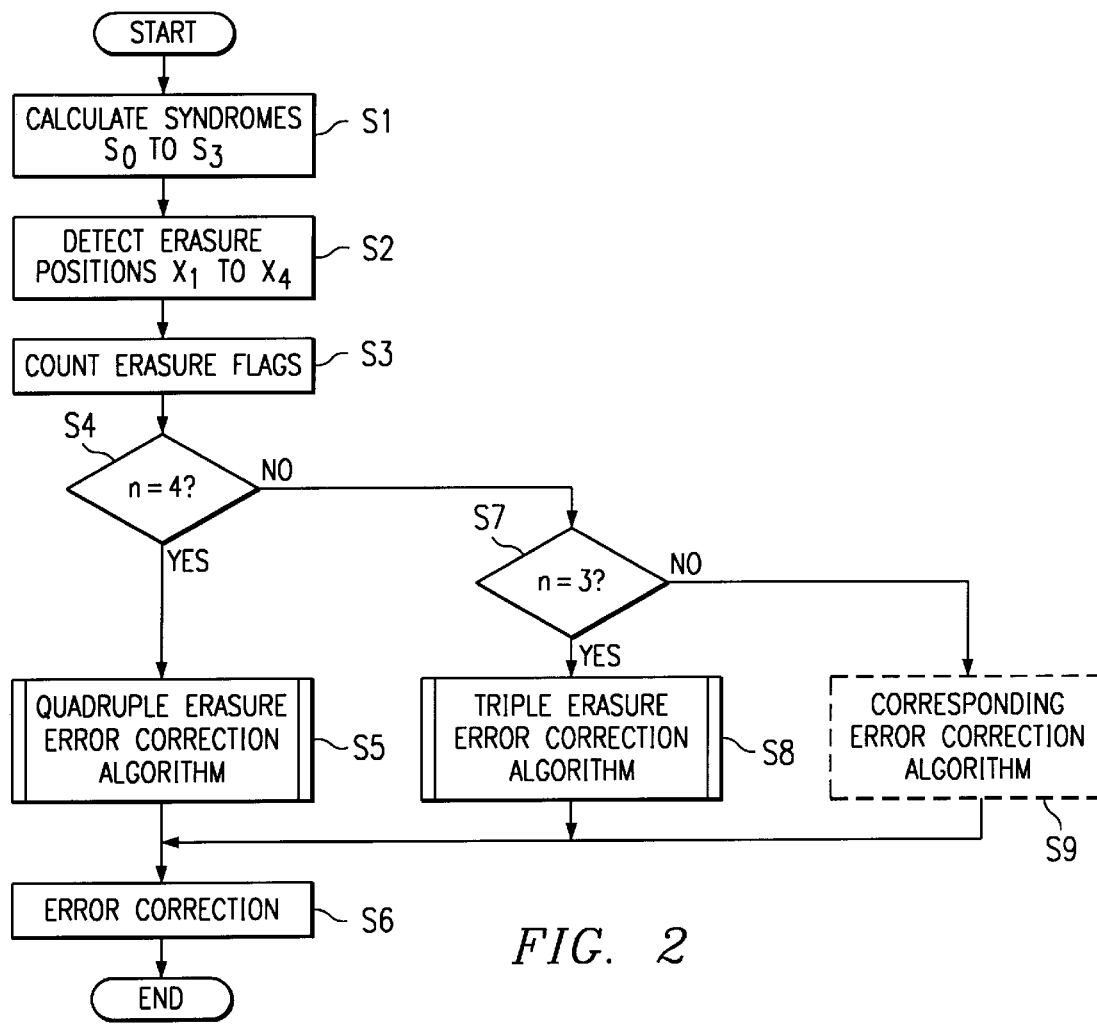
FIG. 2 is a flow chart for a Reed-Solomon decoding method used in the past.
Figure 7:
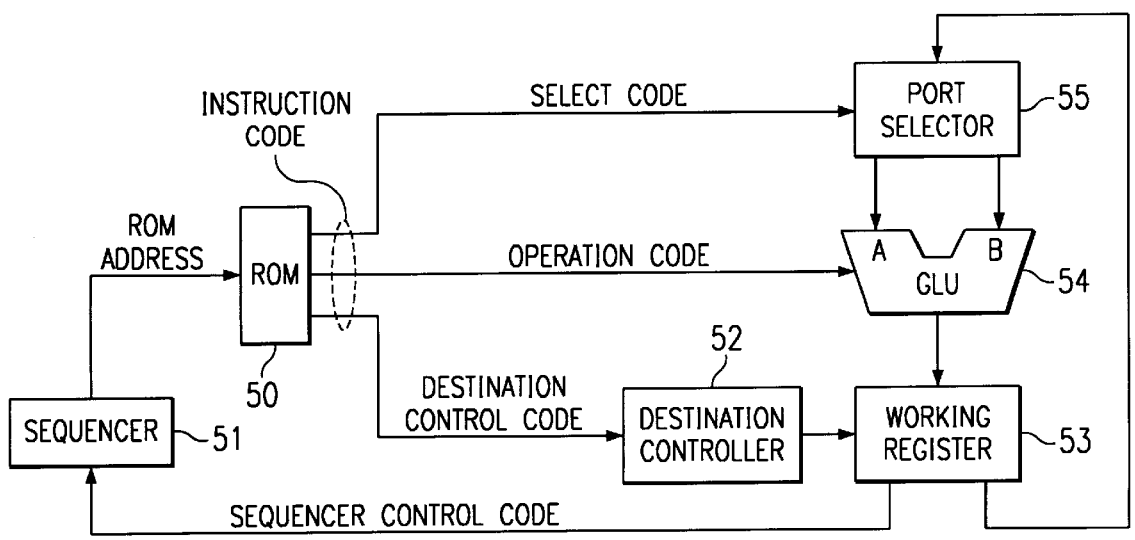
FIG. 7 is a construction diagram of the decoding calculation processing section shown in FIG. 3.
Figure 3:
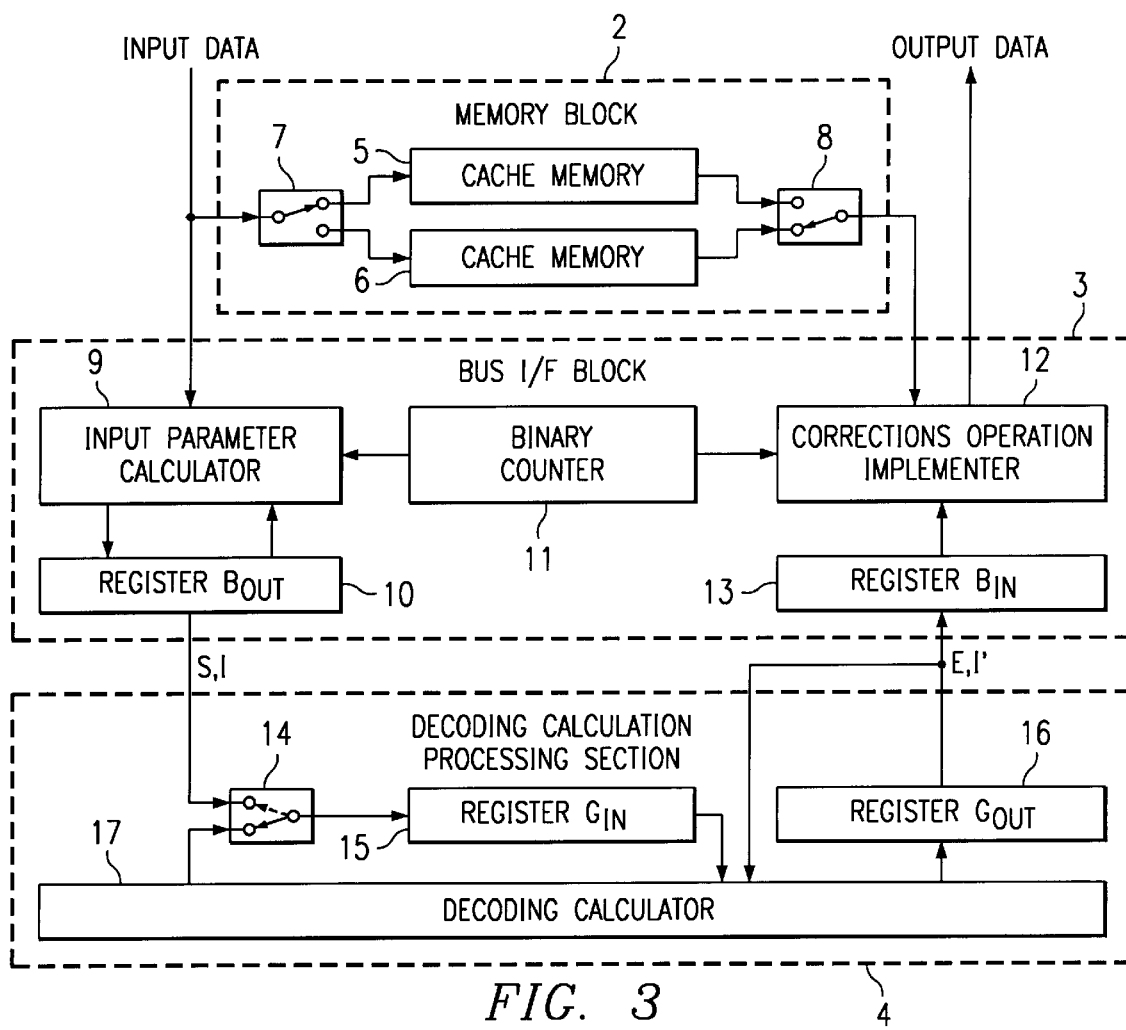
FIG. 3 is a construction diagram of a Reed-Solomon decoding device used in the past.
Figure 8:
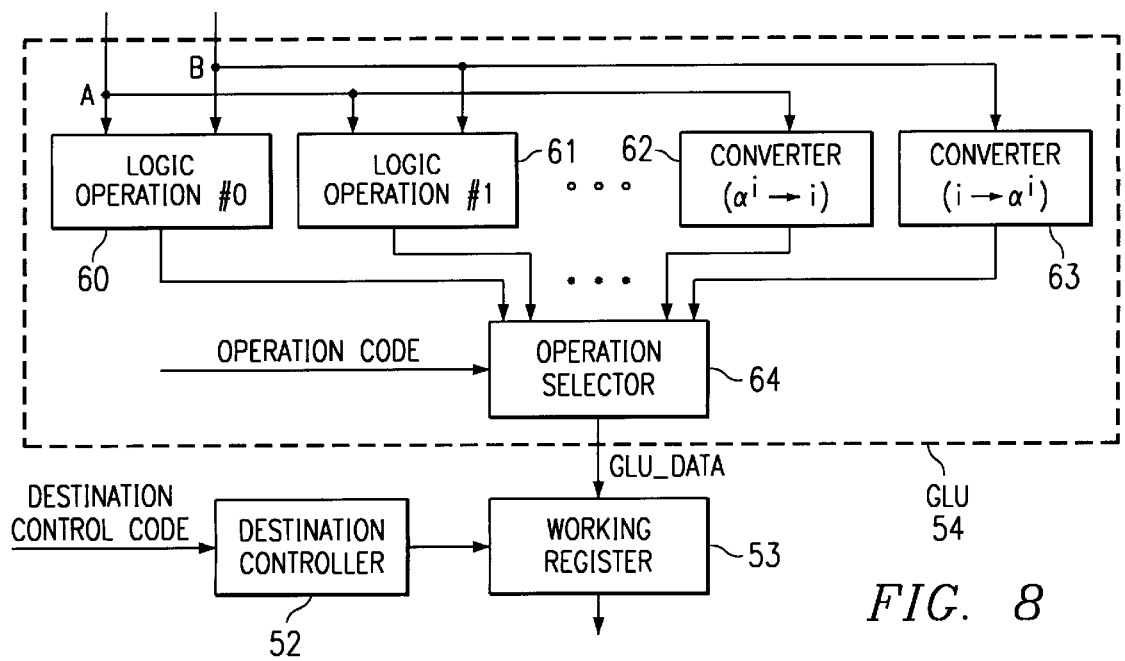
FIG. 8 is a construction diagram of the GLU shown in FIG. 7.
Figure 4:
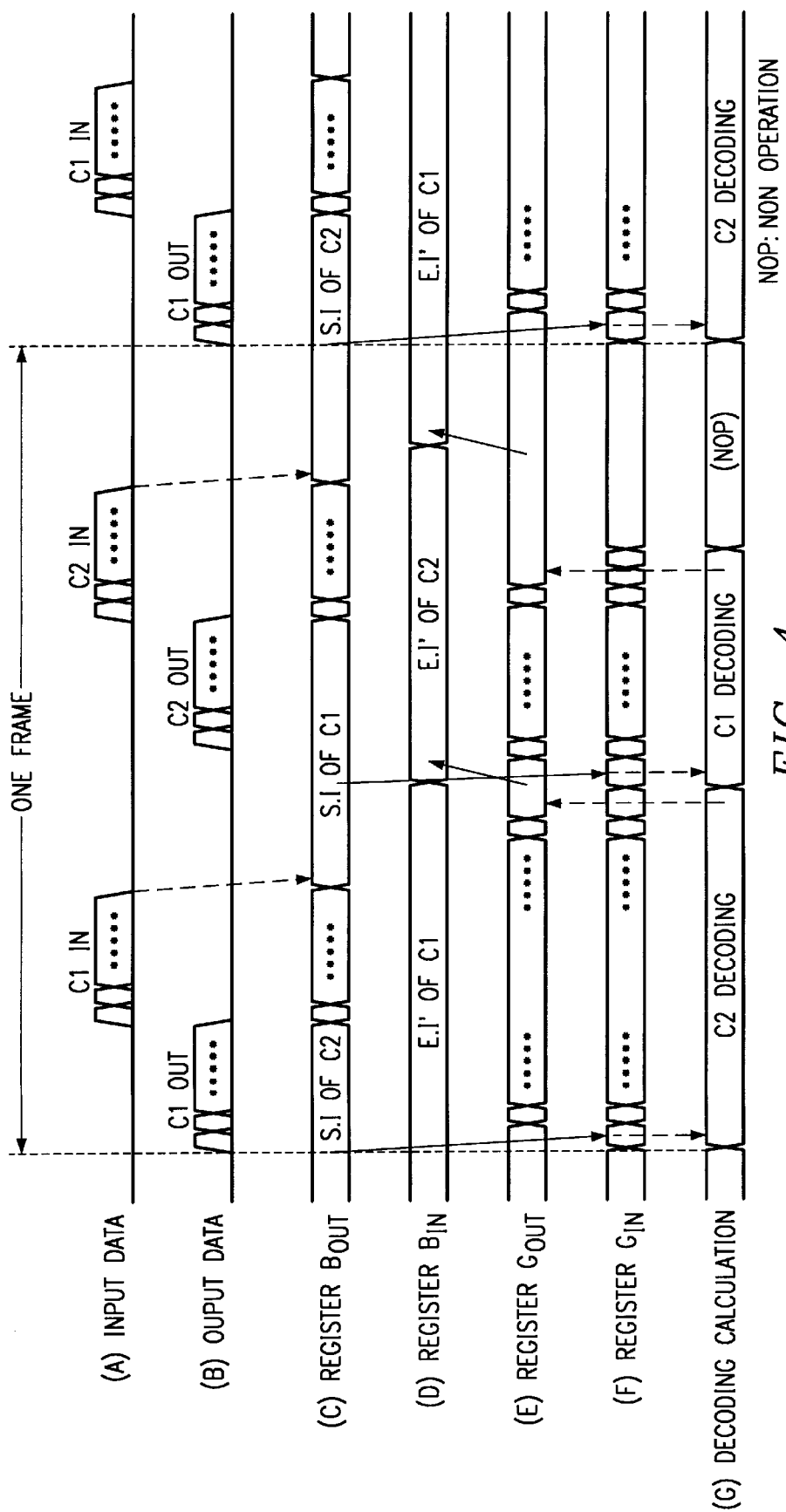
FIG. 4 shows the time sequence for the data and the construction elements during the operation of the Reed-Solomon decoding device shown in FIG. 3, (A) shows the input data, (B) the output data, (C) the storage condition of the register $B_{OUT}$, (D) the storage condition of the register $B_{IN}$, (E) the storage condition of the register $G_{OUT}$, (F) the storage condition of the register $G_{IN}$, and (G) the processing condition of the decoding calculator, respectively.

REFERENCE NUMERALS AS SHOWN IN THE DRAWINGS 1 represents a Reed-Solomon decoding device, 2 is a memory block, 3 is a bus I/F block, 4 is a decoding calculations processing section, 9 is an input parameter calculator, 12 is a corrections operation implementer, 17 is a decoding calculator.

DESCRIPTION OF THE EMBODIMENTS

Below, an explanation is given in regard to Reed-Solomon decoding methods related to embodiments of this invention.

Embodiment 1

FIG. 1 is a flow chart for a Reed-Solomon decoding method related to this embodiment.

One explanation is given for the case of $m_1=3$, $m_2=4$, and t=2.

In this Reed-Solomon decoding method, as is shown in FIG. 1, the syndromes $s_0$ to $s_3$ are calculated (step S11), and the erasure positions $x_1$ to $x_4$ are obtained from these erasure flags (step S12). Then, the number of erasure flags are counted, and this count value is set to n (step S13).

Next, the determination is made as to whether $n<m_1$ or $n>m_2$, in other words, whether n<3 or n>4 (step S14), and in the event n<3 or n>4, since the erasure error correction cannot be performed, the correction operation is not conducted (the solid line 1 in FIG. 1). Or, the conventional error correction has been conducted without using the erasure positions, (the dotted line 2 in FIG. 1), and correction is conducted for less than or equal double error correction (steps S21, 22, 23).

On the other hand, in the event $0 \leq m_1 \leq n \leq m_2 \leq 2t$, in other words, in the event $3 \leq n \leq 4$, the decision is made as to whether n=4(2t) (step S15), and if n=4, the quadruple erasure error decoding calculations for the quadruple erasure error correction are executed by means of the algorithms of Formulas 3, 4, 6, 7, 9, and 10 presented in the prior art, and the error values $e_1$ to $e_4$ are found (step S16). Next, the correction operation is conducted by using these derived error values $e_1$ to $e_4$ and the above-mentioned erasure positions (in other words, error positions) $x_1$ to $x_4$ (step S17).

Also, in the event n does not equal 4 at step (S15), a determination is made as to whether n=3, and in the event n=3, the decoding calculations for the triple erasure error correction are calculated by means of the algorithms of the above-mentioned Formulas 6, 7, 9, and 10, and the error values $e_1$ to $e_3$ are found (step S19).

Incidentally, in the event the number of erasure units is 3, when the decoding calculation results are correct, in other words, in the event no errors are generated outside the erasure positions, there are the relationships shown in the following Formulas 12a to 12d between the $s_0$ to $s_3$ obtained by means of the syndrome calculations from the input string, the erasure positions $x_1$ to $x_3$, and the error values $e_1$ to $e_3$ derived from the decoding and the decoding calculations.

[Mathematical Formula 12]

$$s0 = e1 + e2 + e3 \quad (12a)$$

$$s1 = x1 \cdot e1 + x2 \cdot e2 + x3 \cdot e3 \quad (12b)$$

$$s2 = x1^2 \cdot e1 + x2^2 \cdot e2 + x3^2 \cdot e3 \quad (12c)$$

$$s3 = x1^3 \cdot e1 + x2^3 \cdot e2 + x3^3 \cdot e3 \quad (12d)$$

Here, even when the errors outside of the erasure positions are generated and the results of the decoding calculations are not correct, because the derived $e_1$ to $e_3$ are the solutions of the above-mentioned Formula 5, the above-mentioned Formulas 12a to 12c are necessarily established. However, as for Formula 12d, since it was not used in the decoding calculations, it was not necessarily established, but rather, when errors outside of the erasure positions are generated and the results of the decoding calculations are not correct, the probability that it was not established is high.

Therefore, after the decoding calculations, the right side of the above-mentioned Formula 12d is totaled, and a normal completion decision is conducted as to whether or not this matches the $s_3$ that was obtained by means of syndrome calculations from the input string (step S20). In the case of normal completion, error data $e_1$–$e_3$ and erasure positions $x_1$–$x_3$ are used for correction (step S17).

On the other hand, in the event it is not normally completed, the error correction is not conducted (the solid line (3) in FIG. 1). Or, in the event there was an excess of speed in the corrections, by executing the conventional error corrections that have been conducted without using the erasure positions, corrections for less than or equal double error corrections are conducted (the dotted line (4) in FIG. 1). In this case, along with the error values $e_1$ and $e_2$, the error positions $x'_1$ and $x'_2$ are newly obtained, and the correction operation is conducted (steps S21, 22, 23).

When n=2, the execution of a double erasure error correction and a single error correction is considered. As for this, the error values $e_1$ and $e_2$ are derived by using the erasure positions $x_1$ and $x_2$ in the algorithm for the double erasure error correction, and the error position $x'_3$ and the error value $e_3$ are obtained with the algorithm for a single error correction. The following Formula 13 shows such a relationship between these values and the $s_0$ to $s_3$ that were obtained by means of the syndrome calculations from the input string.

[Mathematical Formula 13]

$$s0 = e1 + e2 + e3$$
$$s1 = x1 \cdot e1 + x2 \cdot e2 + x3 \cdot e3$$
$$s2 = x1^2 \cdot e1 + x2^2 \cdot e2 + x3^2 \cdot e3$$
$$s3 = x1^3 \cdot e1 + x2^3 \cdot e2 + x3^3 \cdot e3$$

[13]

At this time, because the derived values are the 4 comprising $e_1$ to $e_3$ and $x'_3$, the above-mentioned 4 parameters can be obtained by solving the simultaneous Formula comprising the 4 Formulas of the above-mentioned Formula 13, and it is expected that the corrections for 3 bytes can be performed. However, solving the above-mentioned Formula 13 is complex.

As for the simplification of the method in the case of $n \leq 2$ (=t), as is shown in FIG. 1, the corrections for the above-mentioned less than or equal double error corrections are executed without executing the erasure error correction. The reason that this method is effective is that even if it is executed for only a double erasure error correction, the number of correctable units is at the most 2 units, and when an error is generated in the units outside the erasure positions, correcting by solving the above-mentioned 13 is complex. Therefore, in the above-mentioned example, it is desirable for it to be set to $m_1 > t$.

As was explained above, according to the Reed-Solomon decoding method of this embodiment, erroneous correction can be effectively prevented. Also, with the Reed-Solomon decoding method of this embodiment, the correction method is clarified for the case of $n \leq 2$ (=t).

In the above-mentioned embodiment, an explanation is given in regard to the case of t=2 in an example of CIRC encoding, but this application example can be applied to arbitrary values of t. However, in the case of t is a comparatively large value, because directly finding the solution of the simultaneous Formula is very difficult, a repeating algorithm such as the Euclidean decoding method is used. The details in regard to the above-mentioned Euclidean decoding method are in the document "Sugiyama, Hirasawa, et al., A method for solving key equations for decoding Goppa codes, Inf. and Cont., 27, 1975," and in regard to that erasure error correction method, this is in "Sugiyama, Hirasawa, et al., An erasures-and-errors decoding algorithm for Goppa codes, IEEE Transactions Information Theory, 1976."

When this type of repeating algorithm is used, even if an error is generated in units outside the erasure positions, there are cases when correction can be done. In regard to the total number of errors N, correction is possible if N<max {(2t+n)/2}≦2t. At this time, even when n≦t, due to the fact that n<max {(2t+n)/2}, it is also possible to set $m_1 \leq t$. Here, Max { } is a Gauss element, for example, Max {a} shows the maximum integer that (a) cannot exceed.

Also, in regard to the decoding of internal codes of a product code, as for a prescribed number L, if the number of errors that can be Cleared after decoding is larger than Max {(2t+n)/2}–L, the erasure flag for the output is set, and a process is also possible such as not conducting the error correction. If it is done in this manner, the error detection capability for decoding of the internal code can be increased.

As was explained above, according to the Reed-Solomon decoding method of this invention, erroneous correction can be effectively prevented. Also, in the Reed-Solomon decoding method of this invention, the correction method is clarified for the case of n<2 (=t).

What is claimed is:

1. In a Reed-Solomon decoding method that conducts error correction and decodes by using erasure positions showing the position of units of errors for a Reed-Solomon encoded string having parity data of 2t (positive integer) units, a Reed-Solomon decoding method comprising:

finds the number n for the units of error from the erasure position, in the event $0 \leq m_1 \leq n \leq m_2 \leq 2t$ ($m_1$, $m_2$, and n are positive integers), finds the error value by conducting decoding calculations for the erasure error correction of n units, and conducts the error operation by using the error value and the erasure position, in the event n=2t erasure error correction for 2t units, and in the event n<$m_1$ or n>m2 error correction for less than or equal t-multiple error correction by not using the erasure position.

* * * * *